(12) United States Patent
Lochner

(10) Patent No.: US 11,929,732 B2
(45) Date of Patent: Mar. 12, 2024

(54) ELECTRO-ACOUSTIC RESONATOR AND METHOD FOR MANUFACTURING THE SAME

(71) Applicant: RF360 SINGAPORE PTE. LTD., Singapore (SG)

(72) Inventor: Florian Lochner, Taufkirchen (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 339 days.

(21) Appl. No.: 17/297,922

(22) PCT Filed: Dec. 16, 2019

(86) PCT No.: PCT/EP2019/085367
§ 371 (c)(1),
(2) Date: May 27, 2021

(87) PCT Pub. No.: WO2020/127064
PCT Pub. Date: Jun. 25, 2020

(65) Prior Publication Data
US 2021/0328573 A1 Oct. 21, 2021

(30) Foreign Application Priority Data
Dec. 19, 2018 (DE) ............ 10 2018 132 920.2

(51) Int. Cl.
*H03H 9/17* (2006.01)
*H03H 3/02* (2006.01)
(Continued)

(52) U.S. Cl.
CPC ............ *H03H 9/175* (2013.01); *H03H 3/02* (2013.01); *H03H 9/02015* (2013.01); *H03H 9/131* (2013.01); *H03H 9/568* (2013.01)

(58) Field of Classification Search
CPC ...... H03H 9/175; H03H 3/02; H03H 9/02015; H03H 9/131; H03H 9/568; H03H 9/605; H03H 2003/025; H03H 9/02118
See application file for complete search history.

(56) References Cited

U.S. PATENT DOCUMENTS

2010/0134210 A1* 6/2010 Umeda ............... H03H 9/175 333/187
2012/0161902 A1* 6/2012 Feng ............... H03H 9/175 333/187
(Continued)

FOREIGN PATENT DOCUMENTS

DE 10241425 A1 3/2004

OTHER PUBLICATIONS

International Search Report and Written Opinion—PCT/EP2019/085367—ISA/EPO—dated Mar. 11, 2020.

*Primary Examiner* — John W Poos
(74) *Attorney, Agent, or Firm* — Polsinelli

(57) ABSTRACT

Electro-acoustic resonator and method for manufacturing the same An electro-acoustic resonator comprises an acoustic mirror (120) disposed on a carrier substrate (110), a bottom electrode (130) and a piezoelectric layer (140). A structured silicon dioxide flap layer (150) is disposed on the piezoelectric layer (140), both layers having a common contact surface. Direct disposal of the silicon dioxide (150) on the piezoelectric layer (140) increases the quality factor of the resonator and leads to enhanced RF filter performance.

14 Claims, 2 Drawing Sheets

(51) Int. Cl.
  *H03H 9/02* (2006.01)
  *H03H 9/13* (2006.01)
  *H03H 9/56* (2006.01)

(56) References Cited

U.S. PATENT DOCUMENTS

2014/0232486 A1* 8/2014 Burak ................ H03H 9/02118
                                                                          333/187
2017/0117872 A1* 4/2017 Morton ................ G10K 11/04
2017/0264267 A1* 9/2017 Tajic ................ H03H 9/02118

* cited by examiner

ELECTRO-ACOUSTIC RESONATOR AND METHOD FOR MANUFACTURING THE SAME

The present Application is a national stage application (under 35 U.S.C. § 371) of international Patent Application PCT/EP2019/085367, filed Dec. 16, 2019, which claims priority to Germany Patent Application 10 2018 132 920.2, filed Dec. 19, 2018, which are hereby incorporated by referenced in their entirety and for all purposes.

TECHNICAL FIELD

The present disclosure relates to an electro-acoustic resonator. Specifically, the present disclosure relates to an electro-acoustic resonator that comprises a piezoelectric layer sandwiched between bottom and top electrodes. The present disclosure also relates to a method to manufacture such an electro-acoustic resonator. The present disclosure also relates to a RF filter that includes several resonators.

BACKGROUND

Electro-acoustic resonators are widely used in electronic devices to perform frequency selective functions. A bulk acoustic wave (BAW) resonator comprises a piezoelectric layer sandwiched between bottom and top electrodes. An electrical signal applied to the electrodes generates a resonating acoustic wave within the piezoelectric layer that is frequency selective to the electrical signal. A RF filter that includes several electro-acoustic resonators may be used in communication equipment to select the wanted signal from the received signal spectrum or shape the to be transmitted spectrum.

A dielectric layer disposed on the piezoelectric layer surrounding the acoustically active area generates a step feature on the surface of the piezoelectric layer to substantially confine the acoustic energy within the active area and prevent the acoustic wave from escaping from the active area.

A RF filter that includes an arrangement of multiple BAW resonators in a ladder type structure may be specifically used in state of the art communication services such as the 4G (LTE) communication standard. As the manufacturers of communication equipment always seek to improve the quality of their devices, there is a need to reduce the passband characteristics of the RF filters, for example, increase the transmission or reduce the attenuation within the passband portion of a RF filter. Even a moderate step of improvement of the filter performance is welcome to the communication equipment manufacturer. Accordingly, there is a need to improve the quality factor of a BAW resonator and improve the passband performance of a RF filter.

It is object of the present disclosure to provide an electro-acoustic resonator of the bulk acoustic wave type that exhibits an improved quality factor.

It is another object of the present disclosure to provide a method for manufacturing an electro-acoustic resonator that exhibits an improved quality factor.

It is yet another object of the present disclosure to provide a RF filter with improved passband performance.

SUMMARY

An electro-acoustic resonator that achieves one or more of the above-mentioned objects comprises the features of present claim 1.

According to embodiments, an electro-acoustic resonator comprises a carrier substrate and an acoustic mirror disposed thereon. A sandwich of a bottom electrode, a piezoelectric layer and a top electrode is disposed on the acoustic mirror forming an acoustically active area in the overlap region of bottom and top electrodes. A silicon dioxide layer is disposed on portions of the piezoelectric layer. The silicon dioxide layer is structured and surrounds the acoustically active area, wherein the portion of the silicon dioxide layer in the active area has been removed.

The structured silicon dioxide layer and the piezoelectric layer have a common contact surface. The silicon dioxide layer is directly disposed on the piezoelectric layer without an intervening layer such as a seed layer, e.g., a metal or titanium seed layer. The piezoelectric layer and the structured silicon dioxide layer have a direct mechanical contact with each other. With a direct deposition of the silicon dioxide layer on the piezoelectric layer, the electro-acoustic characteristics of the resonator are improved. It turned out that the quality factor of the electro-acoustic resonator is improved so that a RF filter using several of these resonators, for example, in a ladder type filter structure has less attenuation and higher transmission in the passband frequency region of the filter.

The silicon dioxide layer is deposited on the wafer and is structured using masking and lithography steps to remove a portion in which the top metal electrode is formed thereafter. Also an overlap layer may extend into the area of the removed portion of the silicon dioxide layer. The structured silicon dioxide layer surrounds the region in which the top electrode is disposed. The structured silicon dioxide layer is often called a flap layer. One of the functions of the structured silicon dioxide layer is to confine the acoustic energy within the active area and substantially avoid that acoustic energy leaks from the active area. The structured silicon dioxide layer adds an additional mass on the piezoelectric layer that surrounds the active area so that the acoustic characteristics are changed in the region where the silicon dioxide flap is present which causes an energy confinement effect.

The top electrode as such is made of metal and may be a stack of layers. The top electrode may comprise a layer stack comprising a bottom layer opposite and adjacent to the piezoelectric layer of tungsten, a thereon disposed intermediate layer of aluminum and copper and a thereon disposed top layer of a metal nitride such as titanium nitride. The aluminum-copper layer may be formed by a sputtering technique using an AlCu target. In an example, the bottom electrode may have the same layers as the top electrode. The layer stack of the top electrode is surrounded by the structured silicon dioxide layer. The electrodes form the acoustically active area within the piezoelectric layer, where the piezoelectric layer is sandwiched by the bottom and top electrodes.

According to embodiments, an overlap layer may be disposed on the structured silicon dioxide layer. The overlap layer may extend from the top surface of the silicon dioxide layer into a portion of the acoustically active area where the silicon dioxide layer is removed. The overlap layer extends from the top surface of the silicon dioxide layer along a vertical sidewall of the silicon dioxide layer onto the piezoelectric layer within the acoustically active area. Within the acoustically active area, the metal overlap layer is disposed between the top electrode and the piezoelectric layer. The top electrode covers the active area including a portion of the flap layer and a portion of the overlap layer. The metal overlap layer may comprise a layer stack of a layer of titanium disposed on the silicon dioxide layer and a layer of tungsten disposed on the titanium layer. Both layers of the layer stack may be removed within a portion of the acoustically active area. It is also possible that only the top tungsten layer be removed and the bottom titanium layer of the overlap layer be maintained as an adhesion promoter for the subsequent forming of the top electrode.

The piezoelectric layer may be made of piezoelectric aluminum nitride that may be crystalline, columnar aluminum nitride or may be made of aluminum scandium nitride. Other piezoelectric materials are also useful. The scandium portion within the aluminum scandium nitride piezoelectric layer may be in the range from 0 to about 35 weight-%. Specifically, the scandium portion may be in the range of 5 to 15 weight-%, more specifically, the scandium portion may be of 7 weight-% within the aluminum scandium nitride layer.

One or more of the above-mentioned objects are also achieved by a method comprising the features of present claim 10.

The manufacturing of an electro-acoustic resonator comprises providing a carrier substrate on which an acoustic mirror is disposed. A structured bottom electrode is formed on the acoustic mirror by depositing the layer or the layer stack of the metal bottom electrode and forming the electrode structure by masking and lithography steps. The piezoelectric layer is deposited and extends as a bulk layer on the workpiece. Then, a silicon dioxide layer is formed on the piezoelectric layer so that a common contact surface between the piezoelectric layer and the silicon dioxide layer is established. A portion of the silicon dioxide layer is removed in a structuring step using masking and lithography steps in a region that is opposite the bottom electrode. The piezoelectric layer is exposed at the portion where the silicon dioxide layer is removed. A top electrode is formed on the piezoelectric layer in the region where the piezoelectric layer is disposed so that an acoustically active area is established by the layer stack of bottom electrode, piezoelectric layer and top electrode including a portion of the electrode over the flap layer.

According to embodiments, the silicon dioxide layer is formed on the piezoelectric layer without an intervening layer such as a metal seed layer, for example a titanium seed layer that may be used in conventional resonators.

The silicon dioxide layer may be formed by a physical vapor deposition, wherein a target such as a silicon target is bombarded with argon ions. The reaction chamber includes oxygen as a reactive gas so that silicon dioxide deposits on the surface of the piezoelectric layer. Other deposition techniques are also useful such as chemical vapor deposition that uses a TEOS or silane gas in the reaction chamber to deposit the silicon dioxide layer on the surface of the piezoelectric layer. The PVD deposited silicon dioxide layer has a higher density than a CVD deposited silicon dioxide layer so that the acoustic velocity within a PVD silicon dioxide layer is different from the acoustic velocity in the CVD silicon dioxide layer. The acoustic velocity in the PVD layer is higher than the acoustic velocity in the CVD layer. It turned out that a PVD deposition of the silicon dioxide layer leads to a higher quality factor of the resonator and an enhanced performance of a ladder type RF filter using said resonators when compared to resonators using a CVD silicon dioxide layer.

According to embodiments, the deposition of the piezoelectric layer and the deposition of the silicon dioxide layer are performed in-situ, wherein both deposition processes take place without breaking the vacuum. The deposition processes may use two chambers connected under vacuum. A wafer can be transferred without breaking the vacuum between the chambers. An in-situ process avoids a parasitic forming of a native oxide layer on the piezoelectric layer and ensures that the silicon dioxide layer is directly disposed on the piezoelectric layer without any intervening layers. It turned out that also an ex-situ process, wherein the processing workpiece is transferred from the chamber for the deposition of the piezoelectric layer to another chamber for the deposition of the silicon dioxide layer, achieves good results comparable to the in-situ process and increases the quality factor of the resonator and the performance of a ladder type RF filter.

According to embodiments, an overlap layer is formed after the structuring of the silicon dioxide layer and before the forming of the top electrode. The overlap layer may be made of metal such as a layer stack of titanium and tungsten. At least a portion of the overlap layer is removed in a region opposite the bottom electrode, wherein another portion of the overlap layer remains in the region opposite the bottom electrode so that the overlap layer is disposed between the piezoelectric layer and the top electrode.

One or more of the above-mentioned objects are also achieved by a RF filter comprising the features of present claim 15.

The RF filter includes a series path coupled between a first and a second filter port. The series path includes a serial connection of several electro-acoustic resonators described above. One or more shunt or parallel paths are provided that are coupled between at least one of the resonators of the series path and a terminal for a reference potential such as ground potential. The shunt paths include at least one electro-acoustic resonator as described above. The RF filter exhibits a ladder type structure. The series path may comprise four serially connected resonators, wherein four shunt paths are provided. The resonators of the series and shunt paths may have different resonance frequencies. Practically, the resonators may have three different resonance frequencies. The RF filter exhibits an increased transmission within the filter passband or a reduced attenuation within the filter passband when compared to conventional resonators. The improvement in the filter performance is achieved with the silicon dioxide layer disposed directly on the piezoelectric layer without any intervening layer, preferably with a PVD deposition process. As an example, the filter may be a transmit (Tx) filter for the LTE band 25 which has a passband between 1.85 GHz and 1.915 GHz.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

DETAILED DESCRIPTION OF EMBODIMENTS

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
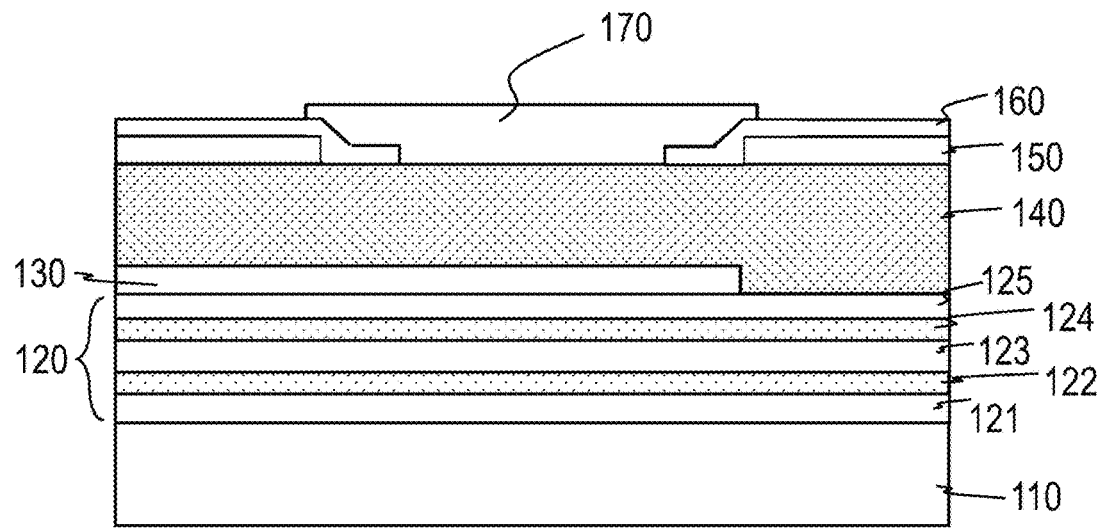
FIG. 1 shows a cross-section of a portion of a bulk acoustic wave resonator.

FIG. 1 depicts a cross-sectional view of a portion of a bulk acoustic wave (BAW) resonator according to the principles of the present disclosure. The resonator is of the solidly mounted resonator (SMR) type that includes an acoustic mirror such as a Bragg mirror on which an acoustically active region is disposed. In more detail, the depicted BAW resonator comprises a carrier substrate no such as a silicon wafer. A Bragg mirror arrangement 120 is disposed on carrier substrate 110. Bragg mirror 120 comprises a number of layers of acoustically higher impedance such as layers 122, 124 that may be made of tungsten and other layers of acoustically low impedance such as layers 121, 123, 125 that may be made of a dielectric material such as silicon dioxide. The topmost layer 125 of the Bragg mirror 120, in the present example, is made of silicon dioxide. A bottom electrode 130 is disposed on Bragg mirror 120. The electrode 130 extends on the left-hand side beyond the portion depicted in FIG. 1 to other circuit elements such as a bump contact to connect electrode 130 to other elements of the electronic circuit. A piezoelectric layer 140 is disposed on the Bragg mirror 120 and on the bottom electrode 130. Piezoelectric layer 140 may be made of aluminum scandium nitride having 7 wt % of scandium in the present example. Other piezoelectric materials such as aluminum scandium nitride with an arbitrary scandium portion or aluminum nitride or another piezoelectric material are also possible.

A dielectric flap layer such as a silicon dioxide layer 150 is disposed on the top surface of the piezoelectric layer 140. The silicon dioxide flap layer 150 is structured by masking and lithography steps to form a portion in which the silicon dioxide layer 150 is removed that is opposite the bottom electrode 130 and accommodates the top electrode 170. Silicon dioxide layer 150 surrounds and encloses the removed portion in which top electrode 170 is disposed. The thickness of the silicon dioxide flap layer may be in the range of 140 nm, for example, for a resonator for a band 25 filter. In a resonator for a filter according to the 5G standard, the thickness may be lower, for example, down to 20 nm.

It is to be noted that silicon dioxide flap layer 150 is disposed directly on piezoelectric layer 140. Silicon dioxide layer 150 has a bottom surface that is adjacent and opposite the top surface of piezoelectric layer 140. Layers 150, 140 have one common contact surface so that no additional layer is disposed between silicon dioxide layer 150 and piezoelectric layer 140. Silicon dioxide layer 150 is in direct mechanical contact with the top surface of the piezoelectric layer 140.

An overlap layer 160, which is made of a metal or a stack of metal layers, is disposed on silicon dioxide layer 150 and extends into the acoustically active area where a portion of silicon dioxide 150 is removed. Overlap layer 160 may comprise a bottom layer of titanium and a top layer of tungsten. Overlap 160 extends over the vertical sidewall of silicon dioxide layer 150 and contacts the top surface of piezoelectric layer 140. The overlap layer 160 is removed from an inner portion of the acoustically active area to allow contact between top electrode 170 and piezoelectric layer 140. Specifically, the top tungsten layer of overlap 160 may be removed, wherein the bottom titanium layer of overlap 160 may be still present as a seed layer in the acoustically active area to enable proper forming of top electrode 170 within the active area on piezoelectric layer 140.

The silicon dioxide layer 150 may be called a flap layer that covers the top surface of the piezoelectric layer except the portions where an electrode contacts the piezoelectric layer 140 such as the top electrode 170 in the acoustically active area. The acoustically active area is formed in the overlap region of bottom electrode 130 and top electrode 170. By application of an electrical RF signal to the electrodes 130, 170, an acoustic resonating wave is generated within the piezoelectric layer 140 between the electrodes 130, 170. The flap layer 150 generates a step feature at its vertical sidewall which has the function of an energy confinement ring surrounding the acoustically active area so that the acoustic energy concentrated in the acoustically active area is prevented from laterally escaping therefrom into the regions of the piezoelectric substrate 140 outside of the acoustically active area and outside of the removed portion of flap layer 150.

During manufacturing of the BAW resonator depicted in FIG. 1, carrier substrate 110 and acoustic mirror 120 disposed thereon are provided, exposing the top dielectric layer 125 of the Bragg mirror arrangement 120. The bottom electrode layer 130 is deposited on the top layer 125 of the Bragg mirror and structured to form the bottom electrode of the acoustically active area. Then, a piezoelectric layer 140 such as an aluminum scandium nitride layer with 7 wt % of scandium is deposited. According to an embodiment, the workpiece may be transferred under vacuum conditions to another deposition chamber for silicon dioxide deposition and the process is continued with the PVD deposition of the silicon dioxide layer 150. During the PVD process, a silicon target is bombarded by argon ions under an oxygen atmosphere so that deposition of silicon dioxide with a thickness of about 140 nm takes place on the surface of the piezoelectric layer 140. No additional layer is generated between piezoelectric layer 140 and silicon dioxide layer 150 during the in-situ deposition of both layers. Then, the silicon dioxide layer 150 is structured in that the portion of said layer opposite the bottom electrode 130 is removed to generate flap layer 150 that forms an energy confinement ring feature for the acoustic resonating wave. An overlap layer 160 is deposited, wherein at least a portion of overlapping layer 160 is removed within a portion of the active area. A top electrode layer 170 is deposited opposite the bottom electrode 130 to form the active area in the overlapping region of bottom and top electrodes 130, 170. The overlap layer 160 may slightly extend from the top surface of the silicon dioxide flap layer 150 along a defined amount of length into the active area underneath top electrode 170.

The etching of the silicon dioxide layer 150 to generate the flap structures may be performed through a dry etching process with suitable agents to dry etch silicon dioxide such as the gases $CF_4$, $CHF_4$, $Ar$, $O_2$. Etching is performed in a region opposite the bottom electrode 130. The etch process continues until the piezoelectric substrate is reached and the piezoelectric substrate is used as an etch stop. The detection of reaction gases from the piezoelectric layer such as aluminum fluoride $AlF_2$ may serve as a detection means to stop the etching.

The PVD sputtering process to deposit the silicon dioxide layer 150 may, in an exemplary process, use the following parameters:
 Temperature of the substrate: 100° C.
 Target power: 2.25 kW
 Oxygen flow: 100 SCCM
 Argon flow: 20 SCCM
 Chamber pressure: 6.7 to 6.9 10-3 Torr (0.89 Pa to 0.92 Pa).
 Platen RF forward power: 325 W The PVD deposition of the flap layer 150 directly on the piezoelectric layer 140 without intervening seed layer achieves a resonator of increased quality factor. A RF filter including several of said resonators has increased performance as explained below.

Figure 2:
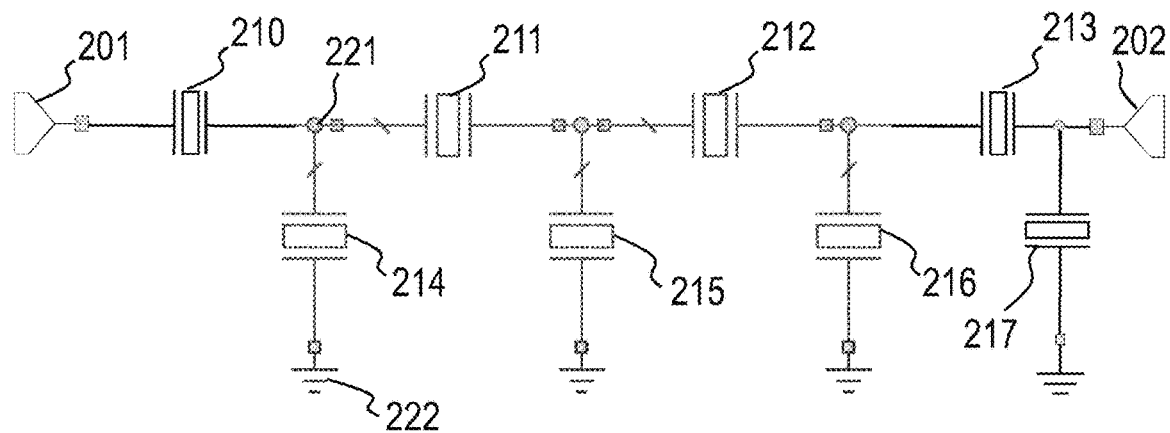
FIG. 2 shows a schematic diagram of a RF filter.

FIG. 2 depicts the schematic diagram of a RF filter. The RF filter comprises a first and a second input/output port 201, 202 between which four series resonators 210, 211, 212, 213 are serially connected. The node between resonators 210, 211 is coupled to a shunt path that includes resonator 214. Resonator 214 is connected between node 221 and terminal 222 for ground potential. Other shunt paths each including a resonator 215, 216, 217 are provided between corresponding nodes of serial resonators and ground potential. The filter topology depicted in FIG. 2 is commonly known as ladder type filter. All resonators 210, . . . , 217 have the structure depicted in FIG. 1 with a flap layer 150 disposed directly on piezoelectric layer 140. According to ladder type circuit concepts, the resonators 210, . . . , 217 may have different resonance frequencies. Three different resonance frequencies are useful for the resonators of the ladder type filter of FIG. 2.

Figure 3:
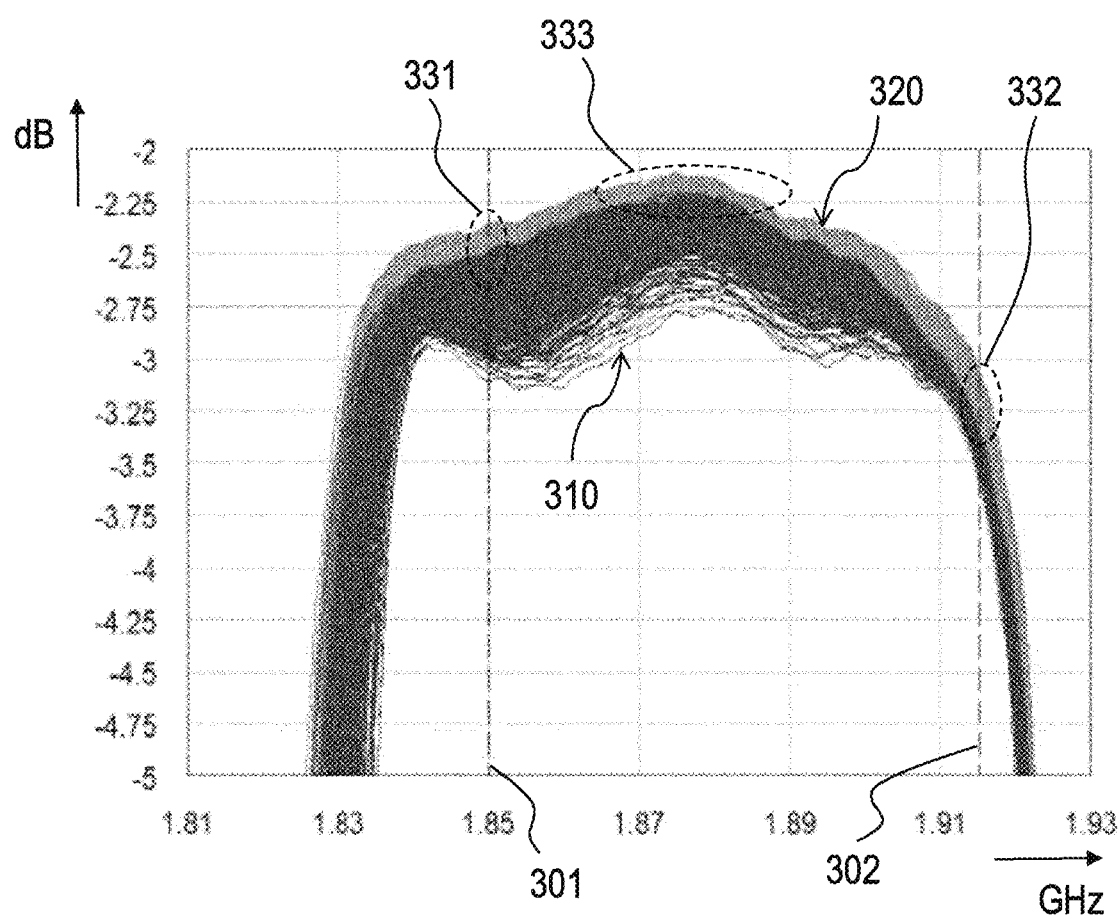
FIG. 3 shows a transmission diagram of the RF filter of FIG. 2.

The filter of FIG. 2 may be dimensioned such that it forms a passband for band 25 as depicted in FIG. 3. The uplink (Tx) passband of band 25 has a lower edge 310 at 1.85 GHz and an upper edge 302 at 1.915 GHz. The diagram in FIG. 3 shows a variety of transmission curves 310 from RF filters with comparative resonators which exhibit a 5 nm thick titanium seed layer between the piezoelectric layer and the 140 nm thick CVD deposited silicon oxide flap layer and a variety of transmission curves 320 from RF filters with BAW resonators according to the principles of the present disclosure described in connection with FIG. 1 which include a 140 nm thick PVD-deposited silicon dioxide layer without seed layer. The curves depicted in FIG. 3 are based on actual measurements from RF filters with resonators disposed on wafers from the same manufacturing lot. The different curves may result from natural non-uniformity variations across the wafer.

As can be clearly gathered from FIG. 3, the RF filter with BAW resonators according to principles of the present disclosure shows transmission curves 320 disposed above the transmission curves 310 according to a comparative RF filter. The transmission curves 320 exhibit a higher transmission and lower attenuation than the comparative transmission curves 310. Specifically, the variety of curves 320 shows an improvement of about 0.1 dB in the area 331 at the lower edge of the passband which is an improvement of about 5%. The improvement at the upper passband edge at area 332 is about 0.3 dB which is an improvement of around 10%. The improvement in the center region is about 0.1 dB which equals about 5% improvement.

It will be apparent to those skilled in the art that various modifications and variations can be made without departing from the spirit or scope of the disclosure as laid down in the appended claims. Since modifications, combinations, subcombinations and variations of the disclosed embodiments incorporating the spirit and substance of the disclosure may occur to the persons skilled in the art, the disclosure should be construed to include everything within the scope of the appended claims.

The invention claimed is:

1. An electro-acoustic resonator, comprising:
 a carrier substrate;
 an acoustic mirror disposed on the carrier substrate;
 a bottom electrode disposed on the acoustic mirror;
 a piezoelectric layer, disposed on the bottom electrode;
 a top electrode disposed on the piezoelectric layer; and
 a structured silicon dioxide layer disposed on portions of the piezoelectric layer surrounding a region in which the top electrode is disposed, the portions of the piezoelectric layer and the structured silicon dioxide layer having a common contact surface.

2. The electro-acoustic resonator of claim 1, wherein the piezoelectric layer and the structured silicon dioxide layer have a common contact surface without a seed layer disposed therebetween.

3. The electro-acoustic resonator of claim 1, wherein the piezoelectric layer and the structured silicon dioxide layer have a direct mechanical contact with each other.

4. The electro-acoustic resonator of claim 1, wherein the structured silicon dioxide layer is structured to have a portion removed in which the top electrode (170) is disposed.

5. The electro-acoustic resonator of claim 1, wherein the top electrode comprises a layer stack comprising a bottom layer of tungsten, an intermediate layer of a composition of aluminum and copper and a top layer of a metal nitride.

6. The electro-acoustic resonator of claim 1, further comprising a metal overlap layer disposed on the structured silicon dioxide layer and extending underneath a portion of the top electrode layer, wherein the metal overlap layer is disposed between the top electrode (170) and the piezoelectric layer at said portion.

7. The electro-acoustic resonator of claim 6, wherein the metal overlap layer comprises a layer stack of titanium and tungsten.

8. The electro-acoustic resonator of claim 1, wherein the piezoelectric layer comprises one of aluminum nitride and aluminum scandium nitride.

9. A method for manufacturing an electro-acoustic resonator, comprising:
 providing a carrier substrate and an acoustic mirror disposed on the carrier substrate;
 forming a structured bottom electrode on the acoustic mirror;
 forming a piezoelectric layer on the bottom electrode;
 forming a layer of silicon dioxide on the piezoelectric layer thereby forming a common contact surface between the layer of silicon dioxide and the piezoelectric layer;
 removing a portion of the silicon dioxide layer in a region opposite the bottom electrode thereby exposing the piezoelectric layer; and
 forming a top electrode on the piezoelectric layer in the region of the exposed piezoelectric layer.

10. The method of claim 9, wherein the layer of silicon dioxide is formed on the piezoelectric layer without an intervening metal seed layer.

11. The method of claim 9, wherein the step of forming a layer of silicon dioxide comprises depositing the layer of silicon dioxide by physical vapor deposition.

12. The method according of claim 9, wherein the step of forming a piezoelectric layer and the step of forming a layer of silicon dioxide are performed without breaking a vacuum.

13. The method of claim 9, after the step of removing a portion of the silicon dioxide layer and before the step of forming a top electrode, performing a step of forming an overlap layer made of metal and removing a portion of the overlap layer in a region opposite the bottom electrode so that the overlap layer is disposed between the top electrode and the piezoelectric substrate in a region where the portion of the silicon dioxide layer is removed.

14. A Radio frequency (RF) filter, comprising:
   a first and a second port;
   a series path coupled between the first and second ports, the series path comprising a serial connection of electro-acoustic resonators; and one or more shunt paths coupled to at least one of the resonators of the series path, the one or more shunt paths each including at least one electro-acoustic resonator comprising:
   a carrier substrate;
   an acoustic mirror disposed on the carrier substrate;
   a bottom electrode disposed on the acoustic mirror;
   a piezoelectric layer, disposed on the bottom electrode;
   a top electrode disposed on the piezoelectric layer; and
   a structured silicon dioxide layer disposed on portions of the piezoelectric layer surrounding a region in which the top electrode is disposed, the portions of the piezoelectric layer and the structured silicon dioxide layer having a common contact surface.

* * * * *